US010594249B1

(12) United States Patent
Woodall et al.

(10) Patent No.: US 10,594,249 B1
(45) Date of Patent: Mar. 17, 2020

(54) PHOTOVOLTAIC-PHASE CHANGE BATTERY SYSTEM FOR CONVERTING INTERMITTENT SOLAR POWER INTO DAY AND NIGHT ELECTRIC POWER

(71) Applicants: Jerry M. Woodall, Davis, CA (US); Thomas E. Rowley, San Jose, CA (US)

(72) Inventors: Jerry M. Woodall, Davis, CA (US); Thomas E. Rowley, San Jose, CA (US)

(*) Notice: Subject to any disclaimer, the term of this patent is extended or adjusted under 35 U.S.C. 154(b) by 0 days.

(21) Appl. No.: 16/297,149

(22) Filed: Mar. 8, 2019

Related U.S. Application Data

(60) Provisional application No. 62/662,359, filed on Apr. 25, 2018.

(51) Int. Cl.
*H02S 10/30* (2014.01)
*H02S 20/30* (2014.01)
*H02S 40/44* (2014.01)
*H01L 31/028* (2006.01)
*H01L 31/042* (2014.01)
*H01L 31/0304* (2006.01)

(52) U.S. Cl.
CPC ............ *H02S 10/30* (2014.12); *H01L 31/028* (2013.01); *H01L 31/0304* (2013.01); *H01L 31/042* (2013.01); *H02S 20/30* (2014.12); *H02S 40/44* (2014.12)

(58) Field of Classification Search
CPC .......... H02S 10/30; H02S 20/30; H02S 40/44; H01L 31/028; H01L 31/0304
USPC .................................................. 136/242–265
See application file for complete search history.

(56) References Cited

U.S. PATENT DOCUMENTS

| | | |
|---|---|---|
| 4,316,048 A | 2/1982 | Woodall |
| 4,389,533 A | 6/1983 | Ames |
| 5,932,029 A | 8/1999 | Stone |
| 2015/0256119 A1 | 9/2015 | Datas Medina et al. |

*Primary Examiner* — Eli S Mekhlin
*Assistant Examiner* — Kourtney R S Carlson
(74) *Attorney, Agent, or Firm* — John P. Costello; Costello Law Corp.

(57) ABSTRACT

A photovoltaic phase change battery system for converting intermittent solar power into day and night electrical power is disclosed. A photovoltaic array is pointed toward a solar energy source, such as Earth's sun during daytime operation, where a portion of the electricity generated is used to convert a pool of phase change material to a molten state. During night time operation the photovoltaic array is pointed at the phase change material to receive photons from thermal radiation and continue the electricity generating process.

8 Claims, 6 Drawing Sheets

PHOTOVOLTAIC-PHASE CHANGE BATTERY SYSTEM FOR CONVERTING INTERMITTENT SOLAR POWER INTO DAY AND NIGHT ELECTRIC POWER

1. RELATED APPLICATIONS

This application claims the benefit of United States Provisional Ser. No. 62/662,359 filed on Apr. 25, 2018.

2. TECHNICAL FIELD

This invention relates to the field of alternative energy and more specifically to a power generation system which uses a solar panel array to provide both day and night electrical power.

3. BACKGROUND

The expired U.S. Pat. No. 4,316,048, (hereinafter the "'048 Patent") by inventor Jerry M. Woodall proposes employing a large insulated area of silicon, which, when melted, stores energy as heat of fusion energy. This concept is also known as a phase change battery (PCB). In the '048 Patent, the silicon or other phase change material, is melted by the sun's rays introduced through a solar concentrator, which transfers concentrated solar energy to the phase change material. The phase change material transitions from a molten state to a solid state, emitting latent heat energy and photon power transfer at a constant temperature while in a molten state and molten-solid state. Electrical energy is created from a photovoltaic cell positioned at a location near the PCB so that it receives radiant heat energy from the phase change material. Greater efficiency of heat to electricity conversion is afforded by using a combination of a thermal-to-radiant-energy directional emitter and a band pass filter, which together operate to permit the passing of only a certain range of photon energies to which the photovoltaic cell is most responsive.

U.S. Pat. No. 4,389,533 issued to Ames describes a photovoltaic device including a solar panel and a container housing a phase change material positioned together so that heat generated during operation of the cells in the panel will melt the phase change material, thereby storing heat and lowering the operating temperature of the cells. However, the photovoltaic array is also producing electricity while simultaneously melting the phase change material. The heat absorbed by the phase change material is used to provide heat, rather than electricity, during night time hours. The primary objective of Ames is to remove heat from the photovoltaic array, especially during peak daylight hours when the array is hottest. A drawback to Ames is that its solution of storing the heat in a phase change material would not work for the hottest parts of the country, or in Summer, when households require cooling, even at night.

United States Patent Publication No. 2015/0256119 to Datas Medina et. al discloses, an energy storage system comprising a vessel made of a refractory material and containing a phase change material, a thermally insulating cover at least partially surrounding the vessel, an emitter made of a refractory material, the emitter having a first side arranged to be heated by the phase change material and a second side intended to radiate thermal power, at least one photovoltaic cell arranged to receive the thermal power emitted by the second side of the emitter, and electric means for heating the phase change material. This reference therefore discloses the use of a PV array directed to receive thermal radiation from a phase change material and convert it into electricity. This reference proposes melting the phase change material using methods including resistive heaters and magnetic means. This reference furthermore discusses using a PV array to generate electricity solely from thermal radiation produced from the melted phase change material.

U.S. Pat. No. 5,932,029 issued to Stone, et al. proposes a system whereby a phase change material such as silicon is heated using focused and concentrated sun rays. The thermal radiation from the phase change material is then processed to extract a band-width which is most efficient for the conversion of thermal energy to electrical energy by a PV array. This system is specifically designed for high-efficiency electrical energy production during times of darkness, such as during an eclipse or during times when sunlight is unavailable and specifically has applications to space vehicles.

This system also employs a cooling sub-system which reduces overall efficiency by removing heat from the PV array; heat that could have been stored in the phase change material and converted to electrical energy. Rather, this system must input energy to circulate cooling fluid through the PV array, so that it performs at a reasonable efficiency level. Moreover, this patent does not propose using a PV array to both melt the phase change material and produce electricity from the sun during daylight hours.

What is apparent, is that the art has not addressed using a PV cell that produces electricity during the day, while introducing energy to melt a phase change material and then using a PV cell at night to produce electricity from latent heat energy radiating from the phase change material.

SUMMARY OF THE INVENTION

The invention is a power generation system which employs a PV cell to produce electricity during daytime operation. A portion of the electricity is used, during the day, to power a heater to melt a phase change material. The invention is also a power generation system which employs a PV cell to produce electricity from photons radiating from a phase change material during night time operation. A phase change energy storage material emits its energy as latent heat when the liquid state becomes a solid at the constant temperature corresponding to the freezing point of the phase change material. It should be noted that this invention preferably involves latent heat energy and photon power transfer at a constant temperature. In a preferred embodiment of the invention, the PV array is pointed at a solar light source, such as Earth's sun during the day, to produce electricity, and then subsequently, pointed at a phase change material at night to produce electricity from heat radiating from the phase change material.

It is an object of this invention to be able to use the same PV array to generate electricity during the day, from solar energy, and then use the same PV array to point at a phase change material, at night, to convert heat energy to electrical energy.

It is another object of this invention to provide a power generation system that is capable of generating electricity on a night and day, 24-hour basis.

These and other advantages and features of the present invention are described with specificity so as to make the present invention understandable to one of ordinary skill in the art.

BRIEF DESCRIPTION OF THE DRAWINGS

The invention will be more fully understood by reference to the following drawings which are for illustrative purposes only.

DETAILED DESCRIPTION OF THE PREFERRED EMBODIMENTS

It has been a trend to tout the viability of "off the grid" housing that typically relies on a photovoltaic array ("PV array") and battery storage to supply the electrical energy needs of a house without being dependent on an electrical utility. One example of this is the Tesla Powerwall™ which uses a rechargeable lithium ion battery. However, like all batteries of current technology, their ability to hold a charge diminishes with time, and at some point, these batteries must be replaced at a significant cost.

An attractive quality of using phase change material, such as silicon, for storing heat energy is that heat energy can be converted to electrical energy. Unlike batteries, the ability of a phase change material to store and release heat energy never diminishes. Therefore, the phase change material never has to be replaced, which is an enormous advantage over standard battery storage.

In order to realize a global scale solar cell economy, a global scale energy storage technology must be realized to load level the localized intermittent terrestrial incident solar irradiance to provide electricity around the clock. In this invention we propose enhancements to the system described in U.S. Pat. No. 4,316,048, which is incorporated herein, by reference. The enhancements relate to a system that integrates three known components:

1. An insulated phase change material, which, when melted, will store energy as the heat of fusion energy. This concept, as described in '048 Patent, is also known as a phase change battery (PCB).
2. A PV array comprised of standard silicon (Si) cells and gallium arsenide (GaAs) cells that absorb sunlight during the day, providing electric power to an electrical grid and, at the same time, providing power to melt the solid Si to a molten state.
3. When the sun sets locally, the PV array is then pointed at the molten Si. The molten Si emits black-body radiation whose spectral distribution is determined by molten Si at a heat of fusion temperature of 1414° C. This radiation is absorbed by the PV array, which is then converted to electricity.

Silicon is the preferred phase change material, wherein Si has the following properties:

| Properties | Si |
|---|---|
| Formula weight | 28.09 |
| Crystal structure | diamond |
| Lattice constant | 5.43095 |
| Melting point (° C.) | 1414 |
| Density (g/cm³) | 2.328 |
| Thermal conductivity (W/cm · K) | 1.5 |
| Latent Heat | 1.66 megajoules/kg (0.46 kWh/kg) |

Figure 1:
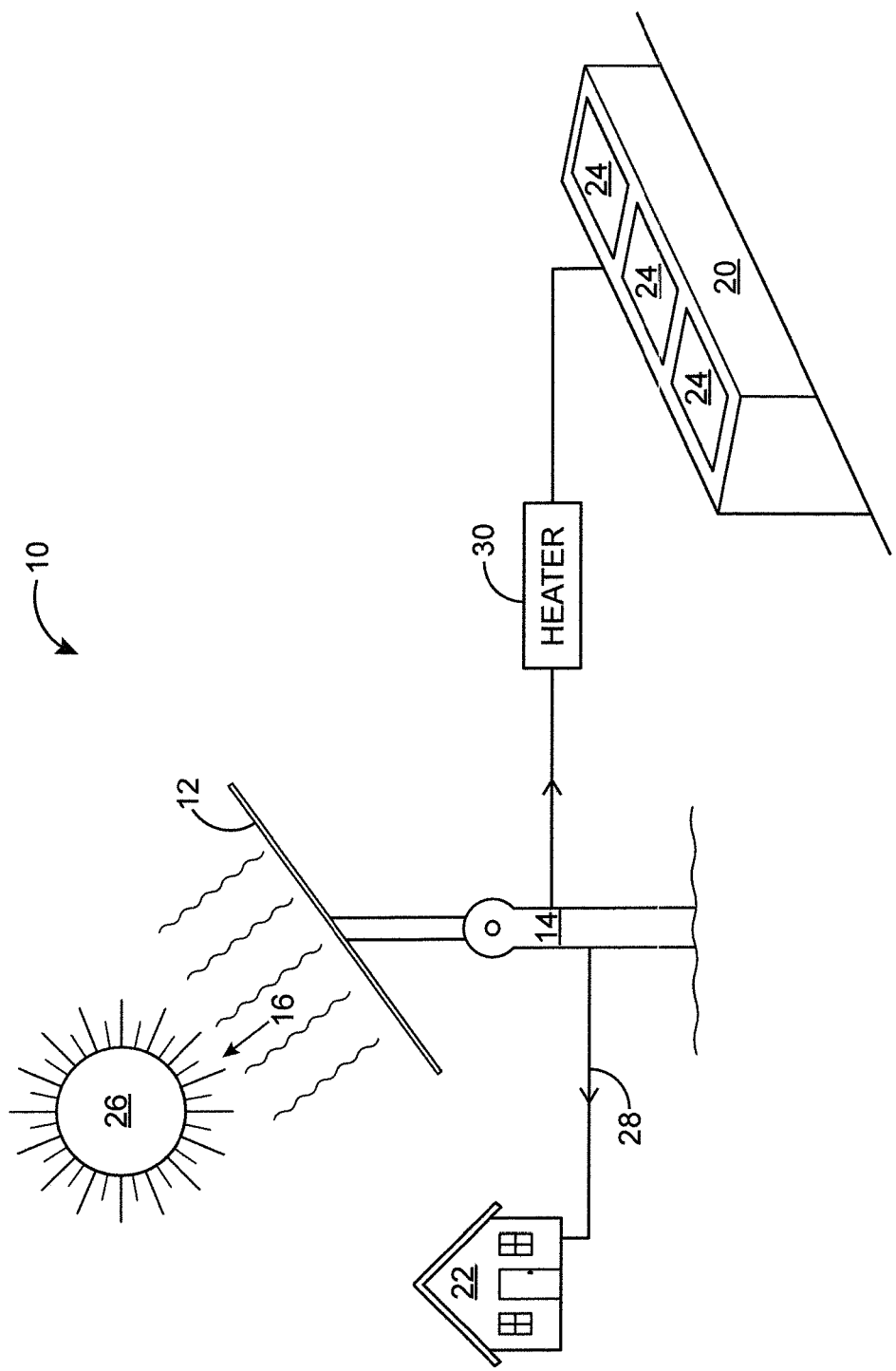
FIG. 1 is a schematic view of the PV phase change battery system shown during daytime operation.

Referring now to FIG. 1, the photovoltaic phase change battery system 10 for converting intermittent solar power into day and night electrical power is shown. A solar PV array 12 is mounted on a stand 14 which allows the PV array 12 to travel from a first, sun-facing direction 16 to a second direction 18 (see FIG. 2) for facing a phase change material. The phase change material emits latent heat energy and photon power transfer at a constant temperature while in a molten state and a molten-solid state. The solar cells of the PV array 12 are preferably a combination of Si solar cells, and gallium arsenide (GaAs) solar cells. The phase change material resides in a heat-resistant container 20 preferably coated with aluminum-oxide cement. Aluminum-oxide cement has been found to be a sufficient material for containing a pool of molten Si phase change material. The container 20 could be further insulated to retain the phase change material in its molten-solid state for as long as possible. Insulated shutters or doors 24 would remain closed on the container 20 until the phase change material is ready to be employed by the PV array 12. During daytime operation, as illustrated in FIG. 1, the PV array 12 is oriented toward the sun 26. Electricity that is produced will be passed to the grid 28, to power a house 22 for example. While a house is discussed herein as an exemplary structure for employing the system, it should be understood that this invention can be scaled up or down to apply to any type of residential, commercial or public structure.

A portion of the electricity produced during daytime operation would be used to power a resistive heater 30 to melt the phase change material contained inside the insulated heat-resistant container 20. In the preferred embodiment, a quantity of about 65 kg of Si phase change material resides in container 20. This amount of Si phase change material has been found to be sufficient to supply the energy needs of an average house 22 which requires about 20 kWh (Kilowatt hours) of electrical energy per 24-hour cycle. By the time the sun goes down, the resistive heater would have rendered the entire quantity of phase change material to a molten state inside of the container 20.

Figure 2:
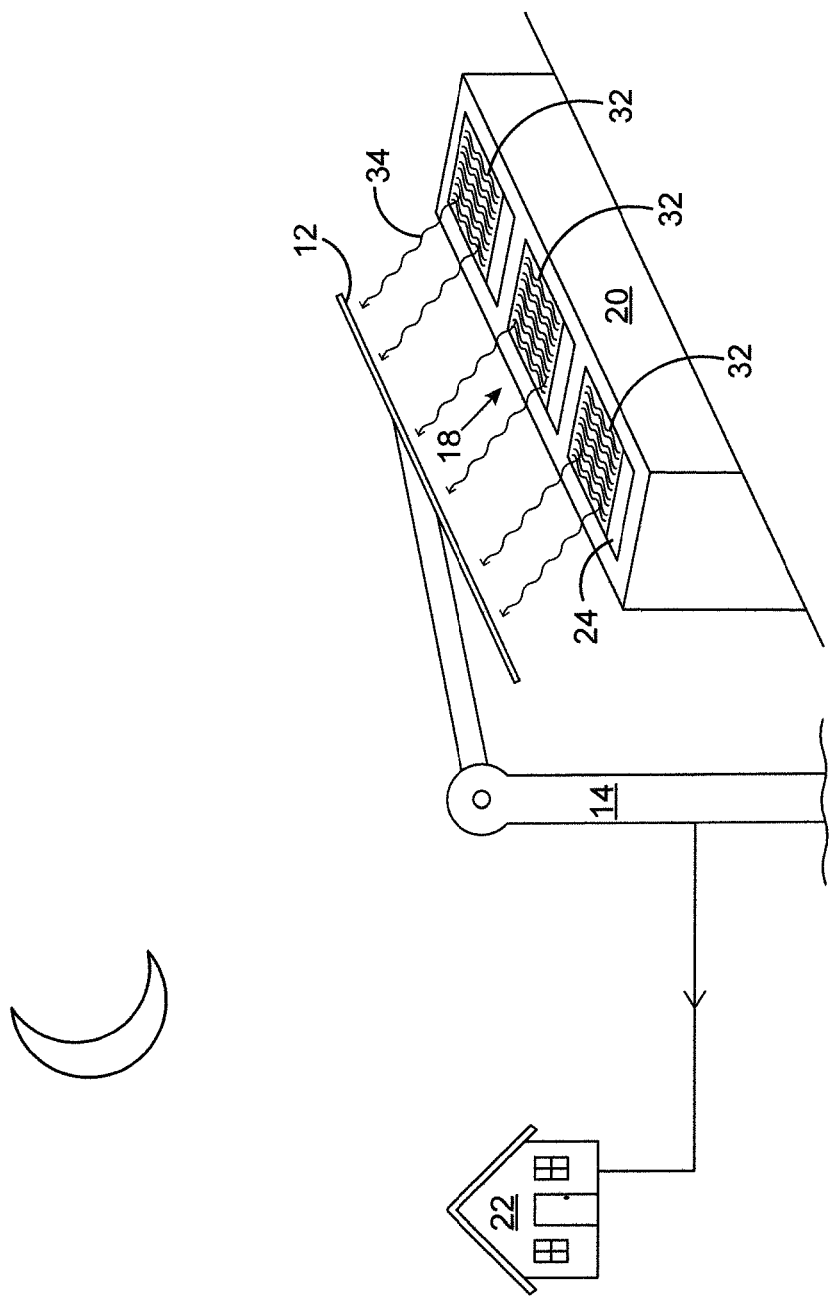
FIG. 2 is a schematic view of the PV phase change battery shown during night time operation.

FIG. 2 shows the system during night time operation where the stand 14 has articulated the PV array 12 into a position facing the heat-resistant insulated container 20. At this time the insulated doors 24 on the container 20 would be in an opened position, giving the PV array 12 full exposure to heat radiating from the phase change material 32. Radiant thermal energy 34 produced from the phase change material 32 is received by the PV array 12 which converts it to electricity throughout the night time operation of the system. This electricity is put into the grid 28 to power a house 22, for example. The phase change material 32 produces radiant thermal energy 34 throughout the night to which the PV array 12 reacts, to produce continuous electricity. The radiant thermal energy produced at night by the phase change material remains constant throughout the night hours.

Figure 3:
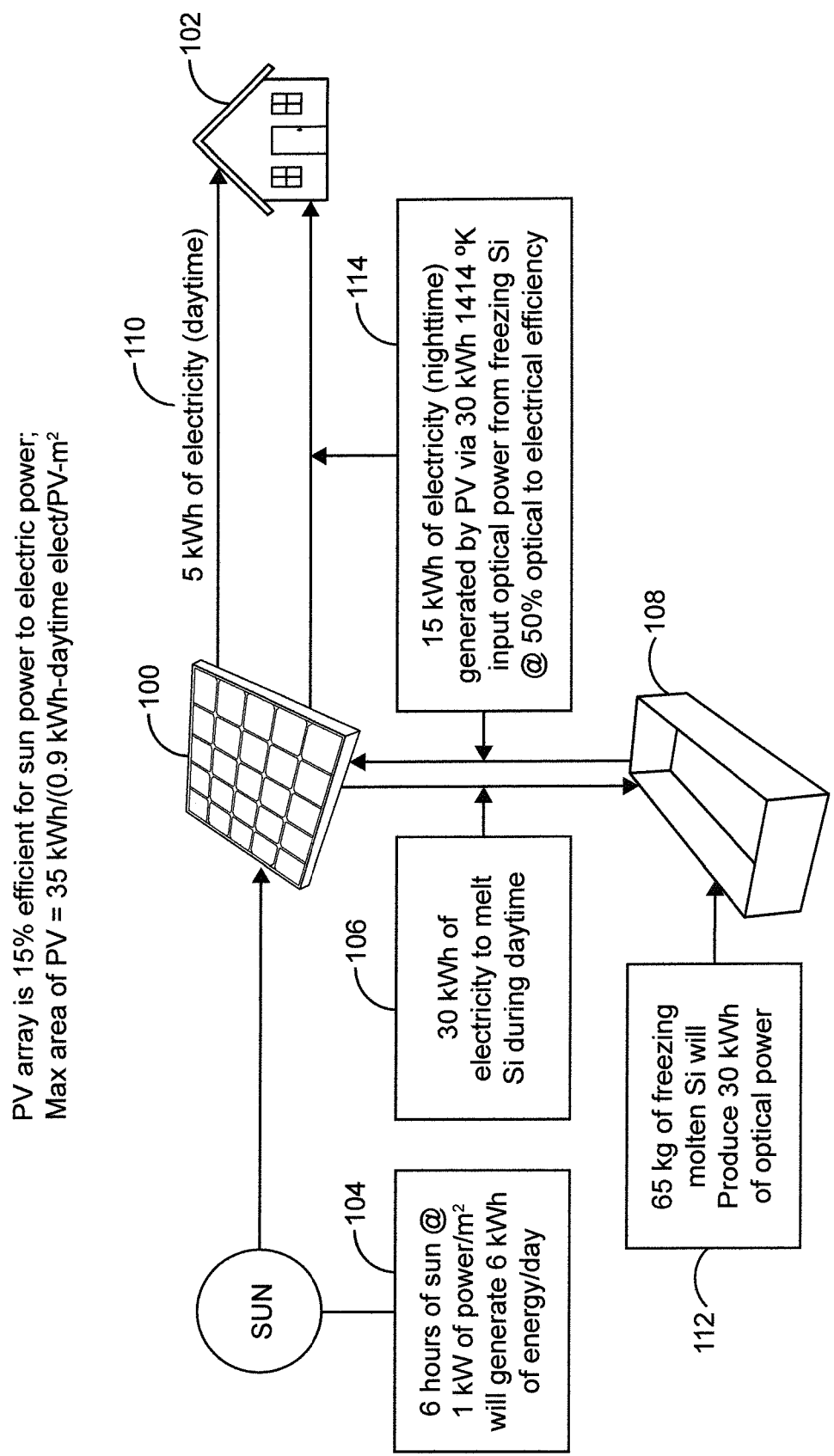
FIG. 3 is a schematic flow chart which illustrates the energy provided by a PV array of the present invention as it transitions from day operation to night operation.

FIG. 3 is a schematic flow chart which illustrates the energy provided by a PV array 100 in accordance with the invention. A typical house 102 in California requires about 20 kWh per 24-hour cycle to satisfy all of its electrical needs. This daily electrical energy need is distributed as 5 kWh generated during the prime sunlight hours (about a 6-hour period) and 15 kWh generated at "night" (the remaining 18 hours of the 24-hour cycle). The daily maximum terrestrial solar power density is 1 kW per $m^2$. Therefore, during daylight hours 104, maximum sunlight will produce 1 kW per $m^2$ of Si PV array surface area; over six hours, the total daily solar energy insolation is therefore 6 kWh/$m^2$ per day. Current-technology Si PV arrays are 15 percent (%) efficient for solar power-to electricity conversion. Therefore, solar insolation will produce a daily electrical energy output from an Si PV array of 6 kWh/$m^2$-day×0.15 (efficiency)=0.9 kWh/$m^2$-day.

Referring still to FIG. 3, the insulated container 108 contains about 65 kg of silicon; this amount of silicon is converted from a frozen to a molten state at 1414° C. To reach this molten state, the PV array 100 must transfer 30 kWh of electricity to melt the Si over six hours, that represent the peak daylight hours of solar insolation. This 30 kWh is diverted 106 to a resistance heater (not shown) in contact with the Si in the container 108 during daylight hours. The 5 kWh 110 to supply the electrical needs of the typical house 102 during the day must be generated from the Si PV array 100. Therefore, to supply the energy (30 kWh) to bring solid Si to a molten state at 1414° C. and to supply the daytime needs (5 kWh) of the house 102, an Si PV array must generate 35 kWh of electricity total. This requires a Si PV array of 39 $m^2$ (e.g. 35 kWh/0.9 kWh/$m^2$-day).

Referring still to the figures. the remaining 18 hours of the day are primarily occupied by darkness bordered by dawn and dusk, which are times of the 24-hour cycle that do not supply significant solar radiation. During this 18-hour span, the system 10 must provide the remaining 15 kWh of electricity necessary for the typical household. This amount is dependent on the heat radiation emission supplied by the 65 kg of Si present in container 108. During this 18-hour span the Si changes its phase from a molten state to a molten-solid state emitting constant heat radiation at its heat of fusion temperature of 1414° C.

The 15 kWh of electricity for the remaining 18 hours of the 24-hour cycle is best achieved by using GaAs cells as part of the PV array. The advantage of GaAs cells when compared with Si cells is that GaAs cells operate at a conversion efficiency of fifty percent (50%), and additionally, GaAs cells facing the thermal output from the phase change material operate at maximal conversion efficiencies up to 400° C. In operation with the phase change material, it has been found that the GaAs cells heat up to a temperature of around 100° C., when the total 30 kWh is emitted at a power rate of 1.66 kW from the 65 kg of phase change material, which is well under the 400° C. maximum. While the GaAs cells are preferably used for converting radiant heat energy emitted from the phase change material, to electricity, the GaAs cells need not be limited to this role, as they could operate in the conversion of solar energy to electricity as well.

GaAs cells are considerably more expensive to produce than Si cells, however, due to their highly efficient conversion rate of fifty percent (50%), only a small surface area of GaAs cells are needed. In fact, it has been found that only 1 $m^2$ of GaAs cells are needed to receive a night power rate of 1.66 kW from the phase change material over the 18-hour span. From this derives the needed 15 kWh of electricity (18 hours×1.66 kW×0.5 (efficiency)=15 kWh), which combined with the 5 kWh generated during the day makes the 20 kWh needed for the power needs of the typical house.

The GaAs cells are preferably arranged as a separate cluster array portion of the PV array, where the Si cells are arranged in their cluster (of 39 $m^2$) and the GaAs cells are located in their separate cluster (of 360 $cm^2$).

Figure 4:
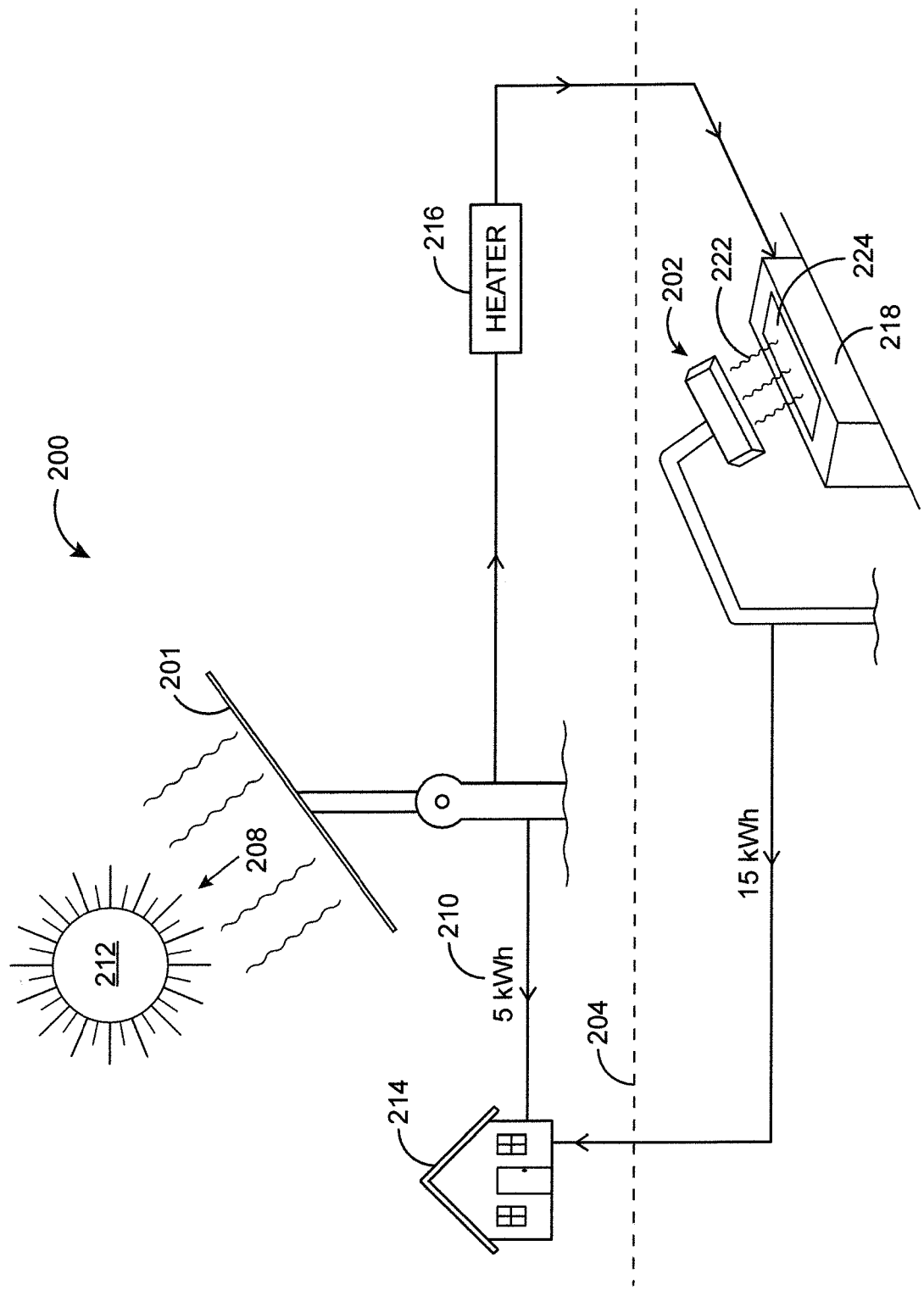
FIG. 4 is a schematic view of an alternate embodiment of the phase change battery system.

FIG. 4 represents an embodiment 200 of a PV array of Si cells 201 and a separate array of GaAs cells 202 in accordance with the invention. Day and night operation are indicated by dotted line 204. PV array comprised of Si cells 201 operates in a sun facing direction 208 during the day to generate about 5 kWh of power 210 from the sun 212 to power the typical house 214 and also to generate 30 kWh of power for resistance heater 216 to melt the phase change material located in insulated container 218. During night operation, a separate GaAs array 202 receives thermal radiation 222 from the phase change material, the thermal radiation traveling through window 224.

Figure 5:
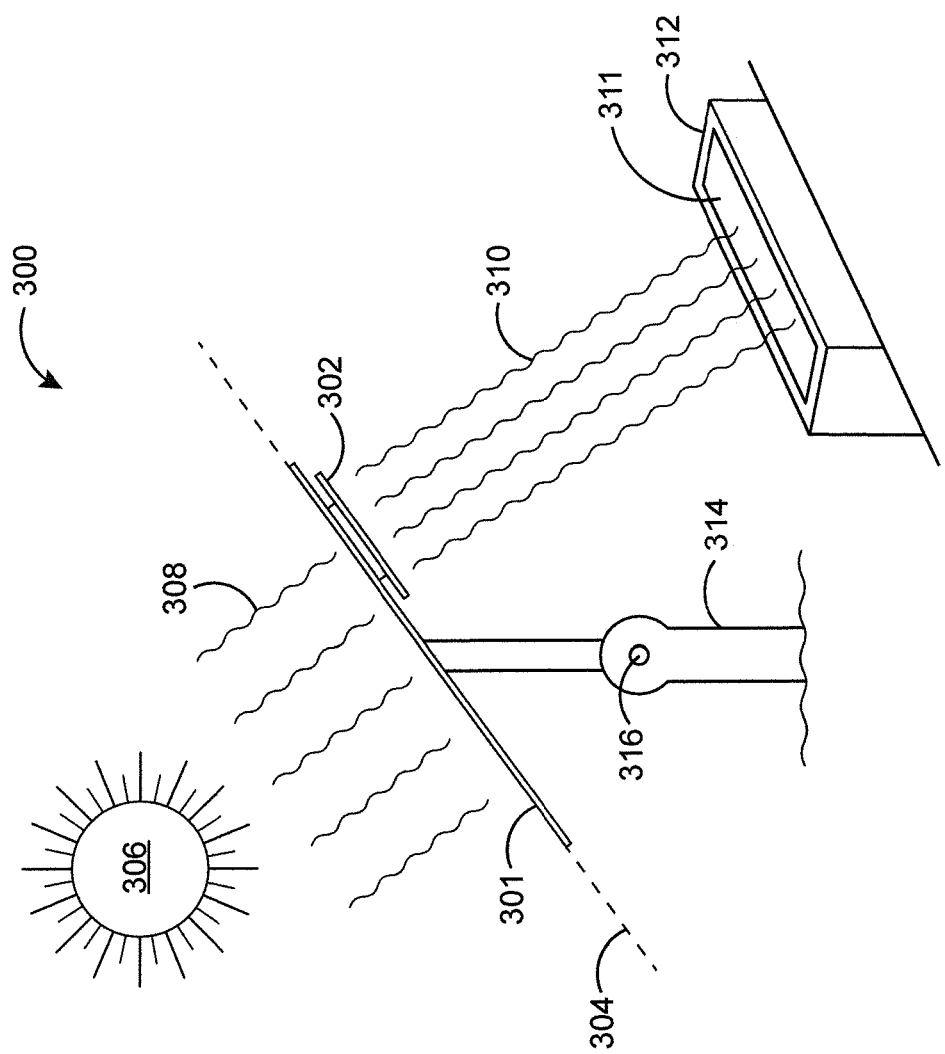
FIG. 5 is a schematic view of an alternate embodiment of the phase change battery system, focusing on the arrangement of the PV array of the system.

FIG. 5 illustrates an alternate embodiment 300 showing how the PV array of Si cells 301 and the smaller array of GaAs cells 302 could be arranged in accordance with the invention. Here again the Si cell array is separate from the GaAs cell array 302. The embodiment 300 is shown in both its day and night modes by dotted line 304. In this embodiment 300, the two separate arrays 301, 302 are pointed in opposite directions. The Si array 301 is pointed toward the sun 306 to receive incident radiation 308 therefrom, while the GaAs array 302 receives thermal radiation 310 through the window 311 of insulated container 312. The separate arrays 301, 302 could be attached to a stand 314 which is capable of articulating 316 to point each respective array into an optimal position for receiving solar radiation 308 in the case of the Si array 301 or thermal radiation 310 in the case of the GaAs array 302.

Figure 6:
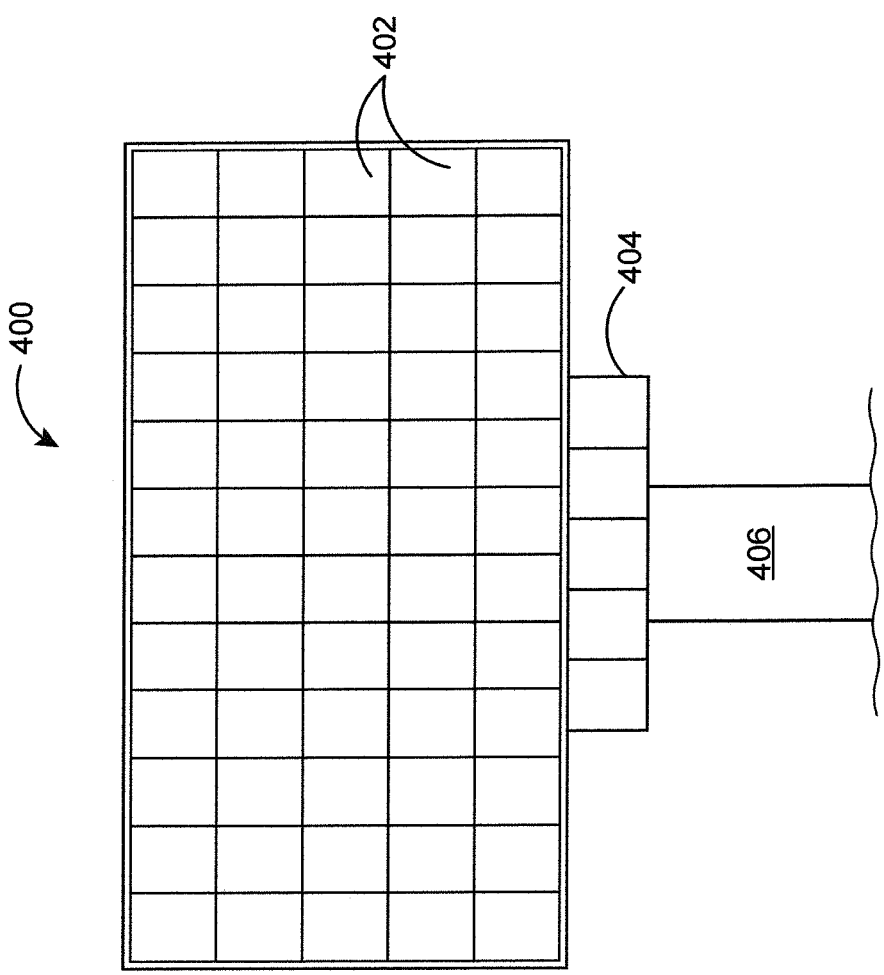
FIG. 6 is representative closeup of a PV array embodiment which would work with the system as presented in FIGS. 1 & 2.

FIG. 6 presents a PV array 400 which has a cluster of Si cells 402 and a separate cluster of GaAs cells 404 (not to scale). The separate clusters of cells 402 and 404 are arranged facing the same direction and would have to be situated on a stand 406 which could articulate in the manner described for the embodiment introduced in FIGS. 1 and 2. It is preferred if the GaAs cells 404 are arranged in a linear array, as shown, so that they could be positioned over a window of the insulated container to capture the maximum radiance of photons emitted through the windows.

The size of the one or more windows located within the insulated container of the embodiments presented herein presents another design consideration due to the fact that the Si phase change material emits a large quantity of radiation, all of which is not immediately needed to power the typical house. In fact, a 1 $m^2$ (10,000 $cm^2$) surface area of Si at 1414° C. will emit radiant power at a rate of 460 kW, which is far more than the 1.66 kW needed to be emitted into the GaAs portion of the PV array to generate 15 kWh of energy. (2×0.83 kW×18 hours=30 kWh). At fifty percent (50%) efficiency, the GaAs cells would output 15 kWh from the 30 kWh input from the thermal radiance. To conserve energy from the Si phase change material as much as possible and to produce the necessary 1.66 kW of energy, the window required would preferably be 36 $cm^2$. (1.66 kW/460 kW)× 10,000 $cm^2$=36 $cm^2$. Therefore, a window of 2 cm×18 cm, for example, is adequate to be placed in the insulated container. The window should preferably be covered by a sapphire cylindrical lens coated with Indium-Tin-Oxide (ITO) to reflect photons with energies below 1.42 electron-volts (eV). The optics of the lens should be designed to image on the GaAs cells of a pattern dimension of 20 cm×18 cm=360 $cm^2$. This will produce a power density on the GaAs array of 1660 Watts/360 cm2=4.6 Watt/$cm^2$, which is equivalent to a solar concentration of 46×. This will cause a steady state temperature rise of 100° C. The rest of the insulated container should be fully insulated to keep heat losses to less than 2 percent (2%) of the 30 kWh of stored thermal energy.

Finally, although the description above contains much specificity, this should not be construed as limiting the scope of the invention, but as merely providing illustrations of some of the presently preferred embodiments of this invention. This invention may be altered and rearranged in numerous ways by one skilled in the art without departing from the coverage of any patent claims, which are supported by this specification.

The invention claimed is:

1. A photovoltaic phase change battery system for converting intermittent solar power into day and night electrical power, the system comprising:
    a photovoltaic cell array;
    a phase change material capable of achieving a molten state or a molten-solid state and radiating photons while in said molten state or in a molten-solid state;
    said photovoltaic cell array facing a solar energy source so as to receive photons from said solar energy source to produce electricity, wherein a portion of said electricity production is channeled to a heater, said heater being in contact with said phase change material to change said phase change material into a molten state or a molten-solid state;
    said same photovoltaic cell array facing said phase change material being in a molten state or a molten-solid state so as to receive photons from said phase change material to produce electricity;
    wherein said photovoltaic cell array is attached to a stand, said stand being capable of articulating said photovoltaic cell array into a first position for facing a solar energy source, said stand being capable of articulating said same photovoltaic cell array into a second position for facing said phase change material in a molten state or a molten-solid state.

2. The photovoltaic phase change battery system as recited in claim 1, said system further comprising a heat-resistant container for containing said phase change material.

3. The photovoltaic phase change battery system as recited in claim 2, wherein said heat-resistant container further comprises at least one insulated, heat-resistant door, said at least one heat-resistant door remaining in a closed position during daytime operation of the system, said at least one heat-resistant door opening during night time operation to expose said photovoltaic cell array to photons emitting from said phase change material in a molten state or a molten-solid state.

4. The photovoltaic phase change battery system as recited in claim 3, wherein said phase change material is Si.

5. The photovoltaic phase change battery system as recited in claim 3, wherein said photovoltaic cell array is comprised of GaAs.

6. The photovoltaic phase change battery system as recited in claim 1, wherein while said photovoltaic cell array is facing a solar energy source and channeling electricity to said heater, a remaining portion of said solar electricity production of said photovoltaic cell array is channeled into a power grid or a house.

7. A structure, including residential, commercial and public structures, incorporating the photovoltaic phase change battery system for converting intermittent solar power into day and night electrical power, as recited in claim 1.

8. The photovoltaic phase change battery system as recited in claim 3, wherein said photovoltaic cell array is comprised of a mixture of GaAs and Si photovoltaic cells.

* * * * *